(12) United States Patent
Herder et al.

(10) Patent No.: US 9,787,220 B2
(45) Date of Patent: Oct. 10, 2017

(54) ENERGY HARVESTER

(71) Applicants: Technische Universiteit Delft, Delft (NL); Stichting voor de Technische Wetenschappen, Utrecht (NL)

(72) Inventors: Justus Laurens Herder, Delft (NL); Nima Tolou, Delft (NL)

(73) Assignees: Technische Universiteit Delft, Delft (NL); Stichting voor de Technische Wetenschappen, Utrecht (NL)

( * ) Notice: Subject to any disclaimer, the term of this patent is extended or adjusted under 35 U.S.C. 154(b) by 704 days.

(21) Appl. No.: 14/256,286

(22) Filed: Apr. 18, 2014

(65) Prior Publication Data

US 2015/0180374 A1    Jun. 25, 2015

Related U.S. Application Data

(63) Continuation of application No. PCT/NL2012/050723, filed on Oct. 18, 2012.

(30) Foreign Application Priority Data

Oct. 18, 2011   (NL) ...................................... 2007609

(51) Int. Cl.
*H01L 41/113*   (2006.01)
*H02N 2/18*   (2006.01)

(52) U.S. Cl.
CPC ........... *H02N 2/18* (2013.01); *H01L 41/1134* (2013.01); *H02N 2/188* (2013.01)

(58) Field of Classification Search
CPC ....... H02N 2/18; H02N 2/188; H01L 41/1134

(Continued)

(56) References Cited

U.S. PATENT DOCUMENTS

| 4,243,838 A  * | 1/1981 | Coffey ..................... H04R 9/06 |
| | | 381/117 |
| 7,737,608 B2 * | 6/2010 | Ruggeri .............. H01L 41/0933 |
| | | 310/328 |

(Continued)

FOREIGN PATENT DOCUMENTS

| DE | EP 2983287 A1 * | 2/2016 | ................ H02N 2/18 |
| WO | WO 2007/061610 A1 * | 5/2007 | ............. H01L 41/08 |
| WO | 2013/062406 | 5/2013 | |

OTHER PUBLICATIONS

Challa, et al., "Towards an autonomous self-tuning vibration energy harvesting device for wireless sensor network applications", Smart Materials and Structures, vol. 20, No. 2, 2011, 1-11.

(Continued)

*Primary Examiner* — Thomas Dougherty
(74) *Attorney, Agent, or Firm* — Peacock Myers, P.C.; Jeffrey Myers

(57) ABSTRACT

An energy harvester comprising a mass that is subjectable to environmental forces for bringing it into the status of a moving mass, and means linked to the mass for converting and storing of energy embodied in the moving mass, which means are arranged for subsequent release of said energy, wherein the mass is part of a compliant system comprising a frame and first and second elastic beams connecting the mass to the frame, wherein the first and second elastic beams are provided with opposite stiffnesses so as to arrange that in a predefined range of excursions of the moving mass, said mass experiences a preselected stiffness.

6 Claims, 5 Drawing Sheets

(58) Field of Classification Search
USPC .......................................................... 310/339
See application file for complete search history.

(56) References Cited

U.S. PATENT DOCUMENTS

| | | | | |
|---|---|---|---|---|
| 2007/0009325 | A1* | 1/2007 | Oigarden | F03B 13/1845 405/75 |
| 2007/0278902 | A1* | 12/2007 | Rastegar | F21L 13/00 310/339 |
| 2008/0136292 | A1* | 6/2008 | Thiesen | B60C 23/041 310/334 |
| 2009/0211353 | A1* | 8/2009 | Gao | B60C 23/0411 73/146.5 |
| 2009/0212665 | A1* | 8/2009 | Koser | B60C 23/0411 310/339 |
| 2010/0045119 | A1* | 2/2010 | Jackson | H02K 35/02 310/20 |
| 2011/0169516 | A1* | 7/2011 | Mcfarland | G01R 1/06722 324/755.05 |
| 2012/0007469 | A1* | 1/2012 | Matova | H01L 41/1136 310/322 |
| 2012/0161583 | A1* | 6/2012 | Kang | H01L 41/113 310/339 |
| 2012/0206016 | A1* | 8/2012 | Ayazi | H02N 2/188 310/339 |
| 2012/0206017 | A1* | 8/2012 | Karkkainen | B60C 23/0411 310/339 |
| 2012/0283807 | A1* | 11/2012 | Deterre | A61N 1/3975 607/116 |
| 2013/0076202 | A1* | 3/2013 | Naito | H02N 1/08 310/300 |

OTHER PUBLICATIONS

Eichhorn, et al., "Bidirectional frequency tuning of a piezoelectric energy converter based on a cantilever beam", J. Micromech. Microeng. 19 094006, 2009, 1-6.

Jung, et al., "Energy-harvesting device with mechanical frequency-up conversion mechanism for increased power efficiency and wideband operation", Applied Physics Letters, vol. 96 Issue 11 111906, 2010, 1-3.

Rhimi, et al., "Temperature compensation in piezoelectric energy harvesters using shape memory alloys", Proc. SPIE. 7981, Sensors and Smart Structures Technologies for Civil, Mechanical, and Aerospace Systems 2011, 798139, 2011, 1-9.

Sneller, et al., "Experimental investigation of a post-buckled piezoelectric beam with an attached central mass used to harvest energy", Proceedings of the Institution of Mechanical Engineers, Part I: Journal of Systems and Control Engineering, vol. 225 No. 4, 2011, 497-509.

Tolou, et al., "Statically Balanced Compliant Micro Mechanisms (SB-MEMS): Concepts and Simulation", ASME 2010 International Design Engineering Technical Conferences and Computers and Information in Engineering Conference vol. 2: 34th Annual Mechanisms and Robotics Conference, Parts A and B Montreal, Quebec, Canada, Aug. 15-18, 2010, 2010, 447-454.

* cited by examiner

ENERGY HARVESTER

CROSS-REFERENCE TO RELATED APPLICATIONS

This application is a continuation application of Patent Cooperation Treaty Application PCT/NL2012/050723, entitled "Energy Harvester", filed on Oct. 18, 2012, which application claims priority to and the benefit of the filing of Netherlands Patent Application No. 2007609, filed on Oct. 18, 2011, and the specifications and claims thereof are incorporated herein by reference.

STATEMENT REGARDING FEDERALLY SPONSORED RESEARCH OR DEVELOPMENT

Not Applicable.

INCORPORATION BY REFERENCE OF MATERIAL SUBMITTED ON A COMPACT DISC

Not Applicable.

COPYRIGHTED MATERIAL

Not Applicable.

BACKGROUND OF THE INVENTION

Field of the Invention (Technical Field):

The present invention relates to an energy harvester comprising a mass that subjectable to environmental forces for bringing it into the status of a moving mass.

Description of Related Art:

In the last decade, the field of energy harvesting has increasingly attracted interest and has gained on importance as evidenced by the growing number of publications and product prototypes. Generally speaking sources for energy harvesting are available in four forms: light, radio waves, temperature gradients and motion. Outdoor solar energy provides a power density of about two orders of magnitudes higher than other sources. However, solar energy is not an attractive energy source for indoor environments. Particularly for indoor application kinematic energy is considered to be an attractive option.

Energy harvesting from for instance ubiquitous environmental vibration and human's everyday movement or other types of movement, particularly but not exclusively by micro-electronic-mechanical systems (MEMS) technology appears to be a promising source of power that can be used for portable devices and wireless sensors networks. The vibration or movement coming from the environment can be converted to electric energy using three types of electromechanical transducers: electromagnetic, electrostatic, and piezoelectric or stored in the form of strain energy for later use.

The article 'Energy-harvesting device with mechanical frequency-up conversion mechanism for increased power efficiency and wideband operation', by Seok-Min Jung and Kwang-Seok Yun, Applied Physics Letters 96, 111906 (2010) discusses an energy harvesting device that uses snap through buckling for a mechanical frequency-up conversion. The proposed device consists of buckled slender bridges with a proof mass and cantilever beams attached on them. This improves the usable bandwidth of the device.

The article 'Experimental investigation of a post-buckled piezoelectric beam with an attached central mass used to harvest energy', by A J. Sneller, P. Celle, and B. P. Mann, Proceedings of the Institution of Mechanical Engineers, part Journal of Systems and Control Engineering 2011 Volume 225, pages 497-509 investigates the response of a buckled piezoelectric beam to harmonic base excitation. This study reports on the effects of an attached mass on persistent snap through behavior, which has clear applications to energy harvesting due to its relatively large amplitude motion.

The article 'Bidirectional frequency tuning of a piezo-electric energy converter based on a cantilever beam', by C. Eichhorn, F. Goldschmidtboeing and P. Woias, Journal of Micro mechanics and Microengineering 19, 2009, pages 1-6 reports on the tuning of the resonance frequency of a piezo-electric energy converter by applying mechanical stress to its structure.

The article 'Temperature Compensation in Piezoelectric Energy Harvesters Using Shape Memory Alloys', by Mohammed Rhimi and Nizar Lajnef, Proceedings of SPE, volume 7981 798139 1-9 discusses that harvested vibration energy is typically considered as an alternative power source for sensors' networks for health and usage monitoring in civil and mechanical structures. The article discusses the effects of temperature deviations on the theoretical harvestable energy levels as well as the compensation methodology.

The article 'Towards an autonomous self-tuning vibration energy harvesting device for wireless sensor network applications', by Vinod R. Challa et al, Smart Materials and Structures, IOP Publishing Limited, Bristol, GB, volume 20, number 2, 25004 discloses an energy harvester comprising a mass that is subjectable to environmental forces for bringing it into the status of a moving mass, and a piezoelectric cantilever linked to the mass for converting and storing of energy embodied in the moving mass, which means are arranged for subsequent release of said energy.

BRIEF SUMMARY OF THE INVENTION

Scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE SEVERAL VIEWS OF THE DRAWINGS

The accompanying drawings, which are incorporated into and form a part of the specification, illustrate one or more embodiments of the present invention and, together with the description, serve to explain the principles of the invention. The drawings are only for the purpose of illustrating one or more preferred embodiments of the invention and are not to be construed as limiting the invention. In the drawings.

DETAILED DESCRIPTION OF THE INVENTION

Figure 1:
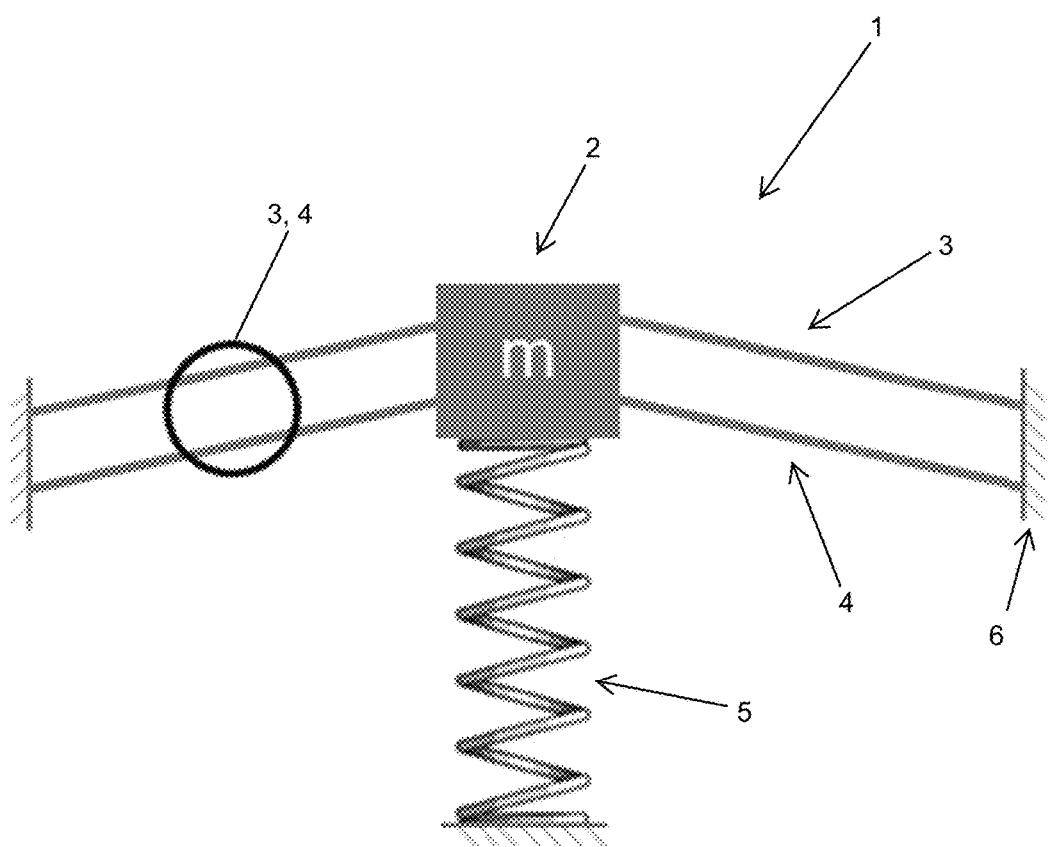
FIG. 1 shows a schematic design of a statically balanced compliant kinetic energy harvester.

Faced with the obvious need for harvesting, storing and releasing of movement energy in all type of applications, it is the object of the invention to meet this demand by proposing an energy harvester comprising a mass that is subjectable to forces (for instance due to vibrations) from the environment for bringing it into the status of a moving mass, and means linked to the mass for converting and storing of energy embodied in the moving mass, which means are arranged for subsequent release of said energy, wherein the mass is part of a system comprising a frame and first and second elastic beams connecting the mass to the frame, wherein the first and second elastic beams are provided with opposite stiffnesses so as to arrange that in a predefined range of excursions of the moving mass, said mass experiences a preselected stiffness.

Considering that for instance the first elastic beam has a positive stiffness, the second elastic beam is arranged with a negative stiffness, wherein the negative stiffness tunes the stiffness of the system down to zero stiffness or near zero stiffness. In principle tuning can be done by either the positive stiffness or with the negative stiffness, albeit that tuning with the positive stiffness is preferred since it is easier to implement. It may then occasionally be beneficial that the preselected stiffness is selected at a value that tunes the mass into resonance with a frequency of environmental vibratory forces.

Generally speaking, by arranging the energy harvester of the invention with the above mentioned features, assembly and maintenance costs are low, yet an effective and accurate conversion of kinematic energy into reusable potential energy comes available which is usable in small scale applications, particularly in a micro-electronic mechanical (MEMS) application, which is particularly suited for arranging the system as a compliant system. Another notable advantage is that the predefined range of excursions of the moving mass at which the preferred zero stiffness or near zero stiffness occurs, and that the range at which this moving mass is made to resonate can be relatively large, so that the harvester of the invention can be applied for the conversion of relatively large energies.

Preferably the means for converting and storing of energy comprises a component that is selected from the group comprising a spring coil, and a piezo-electric element. In case of a microelectronic mechanical systems (MEMS) application, the selected component is preferably a leaf spring. These are means known as such, which are very well equipped to make a reliable conversion of energy.

The energy harvester of the invention is suitably embodied such that the first elastic beam or beams have a predefined first stiffness in the predefined range of excursions of the moving mass, and in said predefined range the second elastic beam or beams have a second stiffness counteracting in said predefined range the first stiffness of the first elastic beam or beams.

The invention will hereinafter be further elucidated with reference to the drawing of an exemplary embodiment of the energy harvester of the invention, which is not limiting to the appended claims.

As shown in FIG. 1, an energy harvester according to the invention is denoted with reference 1. The energy harvester 1 comprises a mass 2 that is subjectable to forces from the environment, which may be vibration, for bringing it into the status of a moving mass 2. There are means 5 linked to the mass 2 for converting and storing of energy embodied in the moving mass 2, which means 5 are arranged for subsequent release of said energy.

The mass 2 is part of a preferably but not necessarily compliant system, comprising a frame 6 and first 3 and second 4 elastic beams connecting the mass 2 to the frame 6, wherein the first 3 and second 4 elastic beams are provided with opposite stiffnesses so as to arrange that in a predefined range of excursions of the moving mass 2, said mass 2 experiences a predefined stiffness, which is preferably a zero stiffness or near zero stiffness. It is preferred that the system of the mass 2 with the first 3 and second 4 elastic beams can be tuned so as to be able to bring the mass 2 into resonance with a frequency of environmental vibratory forces. For this purpose it is beneficial that at least one of the stiffnesses of the first 3 and second 4 elastic beams is tunable.

The means 5 for converting and storing of energy comprises a component that is preferably selected from the group comprising a leaf spring, a coil spring 5, and a piezoelectric element. FIG. 1 shows the selection of a coil spring 5 which is used for converting and storing the energy of the moving mass 2. Other options are however within the ambit of the person skilled in the art and within the scope of the invention. When for instance the system is implemented as a micromechanical electrical system (MEMS) the preferred option is to use a leaf spring as the component for converting and storing the energy.

From the previous description it will be clear that at the core of the design is adding negative stiffness by a static balancer 3, 4 providing zero stiffness to the mass 2 or arranging that it resonates to the forces from the environment when its moving in its frame 6. When zero stiffness or near zero stiffness is applied, the mass 2 can thus be in static equilibrium (i.e., zero stiffness with zero actuation force) in a certain range of motion.

In a statically balanced compliant kinetic energy harvesting system 1 according to the invention, the energy lost due to deflection of elastic members 3, 4, 5 is solved and the natural frequency tuned through stiffness adjustment, therefore the ratio of output/input energy is increased. In other words, for the same amount of force, a larger deflection of the mass 2 can be achieved, or alternatively a smaller mass 2 can undergo the same deflection (i.e., more stain energy can be created). As a consequence thereof, more energy can be harvested and more energy can be stored.

Figure 2A:
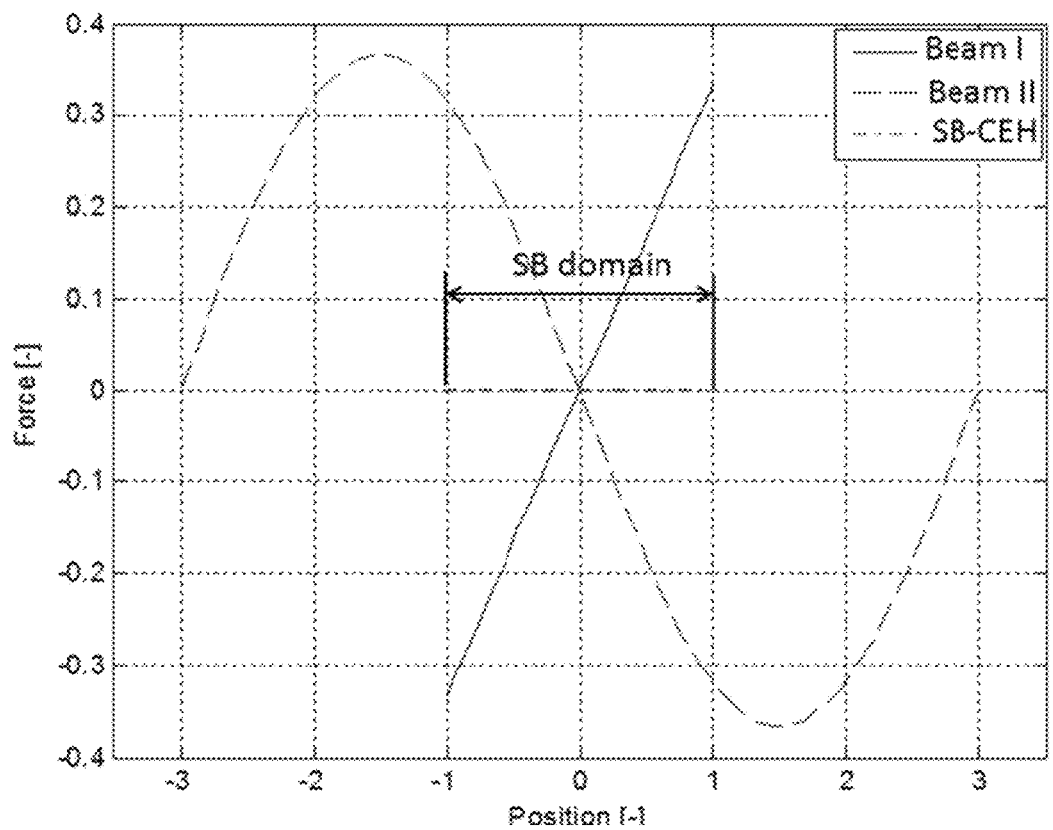
FIGS. 2A-D show force deflection behaviors of the statically balanced compliant kinetic energy harvesting system of FIG. 1 for subsequent (A and B) and cooperative actions of static balancer (SB) and compliant energy harvesting system (CEH) without (C) and with (D) added gravity forces (mass).
Figure 2B:
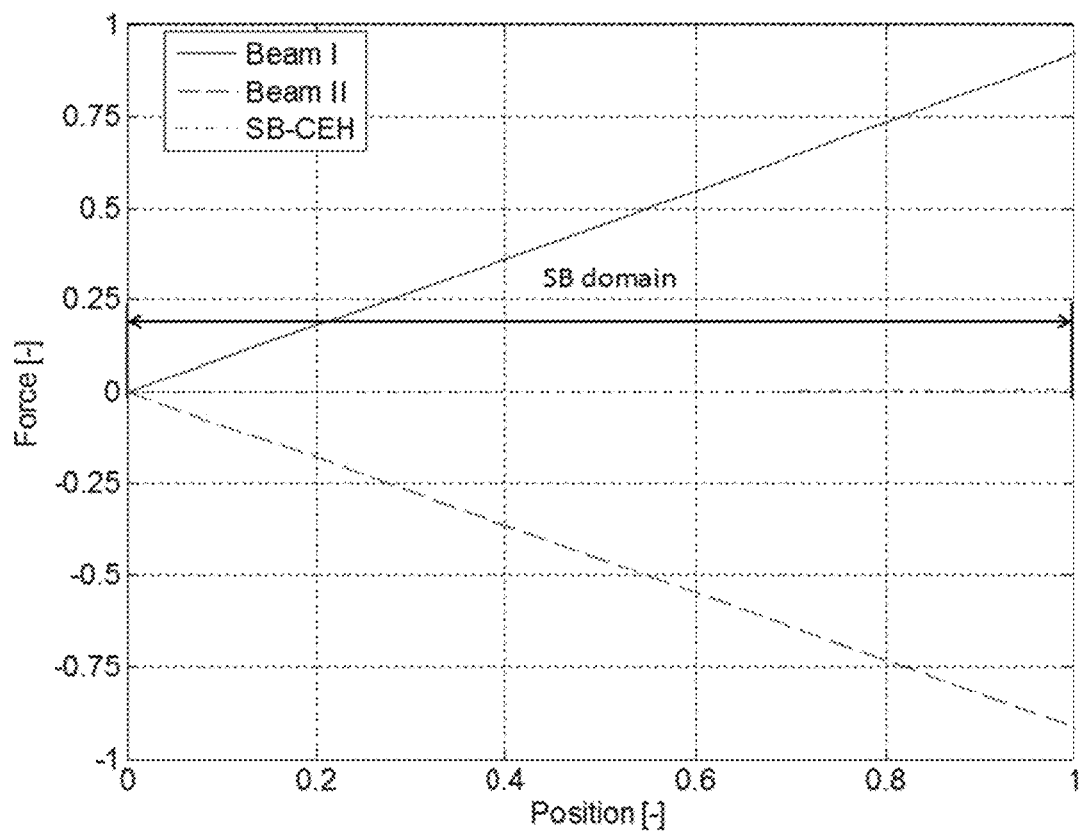
Figure 2C:
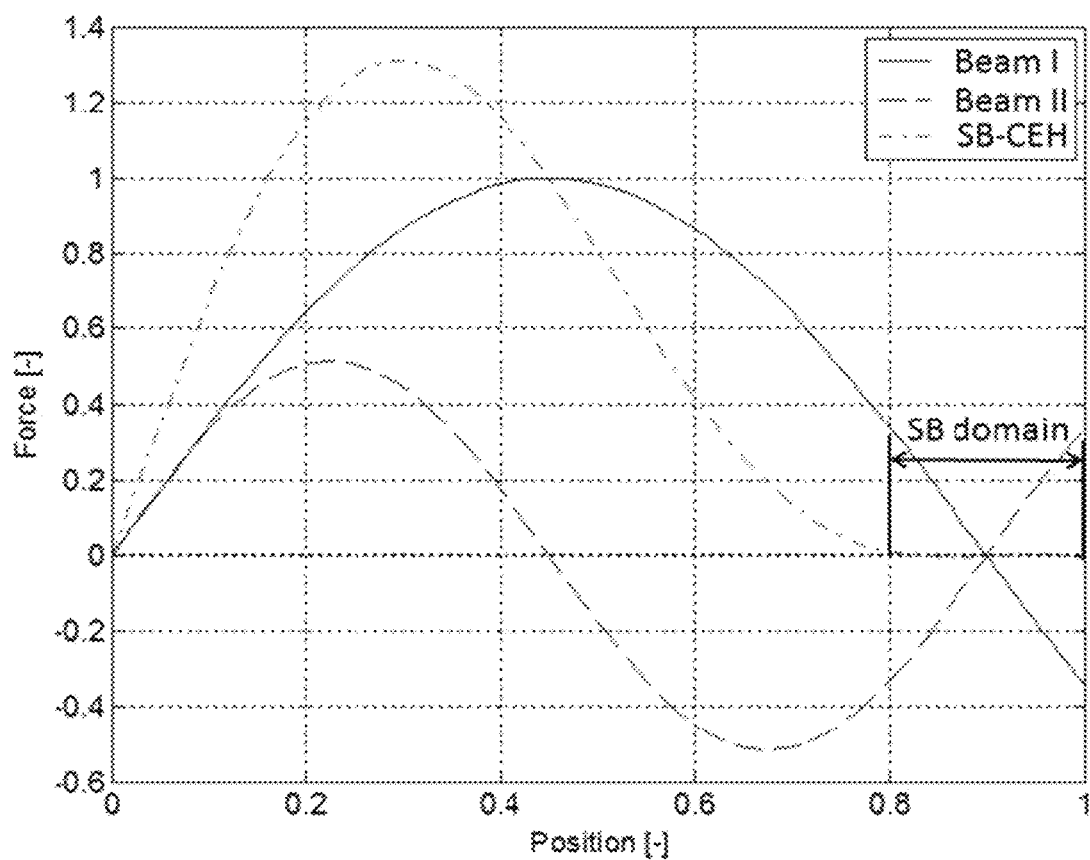
Figure 2D:
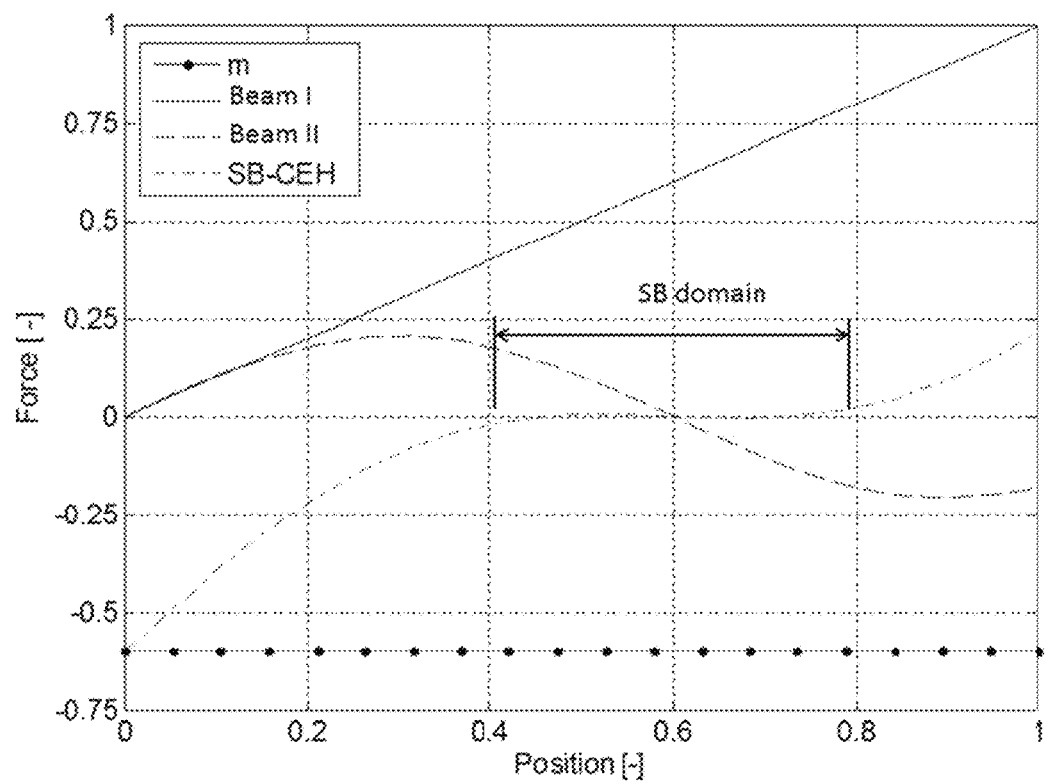

Force deflection behavior of the energy harvester of the invention is shown in FIG. 2a-c.

FIG. 2a shows separately the force-deflection diagram of beam 5 (the solid line) and beams 3, 4 in combination (the interrupted line). At an enlarged scale FIG. 2b the same is shown with respect to the excursions of the mass 2 in the restricted region indicated with the term SB-domain in FIG. 2a.

FIG. 2c finally shows the joint effect of beam 5 (the solid line) and beams 3, 4 (the interrupted line) and the gravity force with a preselected value of the mass 2 (the solid line with denoted marks).

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above are hereby incorporated by reference.

What is claimed is:

1. An energy harvester comprising a mass that is subjectable to environmental forces for bringing it into the status of a moving mass, and means linked to the mass for converting and storing of energy embodied in the moving mass, which means are arranged for subsequent release of said energy, wherein the mass is part of a system comprising a frame and first and second elastic beams connecting the mass to the frame, wherein the first elastic beam has a predefined first stiffness in a predefined range of excursions of the mass, and in said predefined range the second elastic beam has a second stiffness counteracting in said predefined range the first stiffness of the first elastic beam so as to provide that said mass experiences a zero stiffness or near zero stiffness.

2. The energy harvester according to claim 1, wherein the preselected stiffness is selected at a value that tunes the mass into resonance with a frequency of environmental vibratory forces.

3. The energy harvester according to any one Of the previous claims, wherein the means for converting and storing of energy comprises a component that is selected from the group consisting of a leaf spring, a coil spring, and a piezo-electric element.

4. The energy harvester according to claim 1, wherein the system is a compliant system.

5. The energy harvester according to claim 1, wherein the mass is part of a microelectronic mechanical system, and the component for converting and storing of energy is a leaf spring.

6. The energy harvester according to claim 4 wherein the compliant system is a microelectronic mechanical system.

* * * * *